(12) United States Patent
Husko et al.

(10) Patent No.: US 10,374,385 B2
(45) Date of Patent: Aug. 6, 2019

(54) HYBRID SILICON LASERS AND AMPLIFIERS WITH 2D PHOSPHORENE FILM

(71) Applicants: UCHICAGO ARGONNE, LLC, Chicago, IL (US); NORTHWESTERN UNIVERSITY, Evanston, IL (US)

(72) Inventors: Chad Husko, Wauconda, IL (US); Jeff Guest, Lemont, IL (US); Mark Hersam, Evanston, IL (US); Joohoon Kang, Evanston, IL (US); Joshua Wood, Evanston, IL (US); Xavier Checoury, Rue Andre Ampere (FR)

(73) Assignees: UCHICAGO ARGONNE, LLC, Chicago, IL (US); NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/706,109

(22) Filed: Sep. 15, 2017

(65) Prior Publication Data
US 2019/0089123 A1 Mar. 21, 2019

(51) Int. Cl.
| | |
|---|---|
| H01S 5/02 | (2006.01) |
| H01S 5/20 | (2006.01) |
| H01S 5/042 | (2006.01) |
| H01S 5/125 | (2006.01) |
| H01S 5/10 | (2006.01) |
| H01S 5/04 | (2006.01) |
| H01S 5/12 | (2006.01) |
| H01S 5/50 | (2006.01) |

(52) U.S. Cl.
CPC ............. *H01S 5/021* (2013.01); *H01S 5/041* (2013.01); *H01S 5/0425* (2013.01); *H01S 5/105* (2013.01); *H01S 5/1042* (2013.01); *H01S 5/12* (2013.01); *H01S 5/125* (2013.01); *H01S 5/2054* (2013.01); *H01S 5/50* (2013.01)

(58) Field of Classification Search
CPC .......... H01S 5/021; H01S 5/12; H01S 5/1042; H01S 5/041; H01S 5/105; H01S 5/125; H01S 5/0425; H01S 5/2054; H01S 5/50
See application file for complete search history.

(56) References Cited

U.S. PATENT DOCUMENTS

| | | | |
|---|---|---|---|
| 7,869,470 B2* | 1/2011 | Wong | B82Y 20/00 372/3 |
| 8,620,164 B2 | 12/2013 | Heck et al. | |
| 2011/0064106 A1* | 3/2011 | Xu | H01S 5/1071 372/45.01 |

OTHER PUBLICATIONS

Zhang et al., "Extraordinary Photoluminescence and Strong Temperature/Angle-Dependent Raman Responses in Few-Layer Phosphorene", American Chemical Society, vol. 8, No. 9, pp. 9590-9596.*
Buscema et al., "Fast and broadband photoresponse of few-layer black phosphorus field-effect transistors," (2014).

(Continued)

*Primary Examiner* — Xinning (Tom) Niu
(74) *Attorney, Agent, or Firm* — Marshall, Gerstein & Borun LLP (57) ABSTRACT

Hybrid silicon lasers and amplifiers having resonator cavities within a silicon substrate and a two-dimensional material film on the substrate as an optical gain medium are described. The two-dimensional material film may be formed of one or more atomic layers of phosphorene (BP). The number of phosphorene layers may be adjusted to tune the emission wavelength of the hybrid devices.

15 Claims, 12 Drawing Sheets

(56) References Cited

OTHER PUBLICATIONS

Castellanos-Gomez et al., "Isolation and characterization of few-layer black phosphorus," 2D Materials (2014).
Fang et al., "1305 nm $MoTe_2$-on-silicon Laser" (2017).
Husko et al,. "Evidence for a lasing in a hybrid silicon-BP nanocavity," Optical Society of America, 2 pages (2017).
Husko et al., "A hybrid silicon nanolaser," Optical Society of America (2017).
Husko et al., "A hybrid silicon-phosphorene nanolaser," Frontiers in Optics (2017).
Kozlov et al., "Laser action in organic semiconductor waveguide and double-heterostructure devices," Nature 389:362:364 (1997).
Li et al., "Room-temperature continuous-wave lasing from monolayer molybdenum ditelluride integrated with a silicon nanobeam cavi," Nature Nano (2017).
Liu et al., "Phosphorene: An Unexplored 2D Semiconductor with a High Hole Mobility," ACS Nano 8(4): 4033-4041 (2014).
Menon, "Lasing from 2D atomic crystals," Nature Materials 14:370-371 (2015).
Salehzadeh et al., "Optically Pumped Two-Dimensional MoS2 Lasers Operating at Room-Temperature," Nano Lett. 15:5302-5306 (2015).
Samuel et al., "How to recognize lasing," Nat. Photon 3:546-549 (2009).
Takao et al., "Electronic structure of black phosphorus: Tight binding approach," Physica B+C 105(1-3):98-98 (1981).
Wu et al., "Monolayer semiconductor nanocavity lasers with ultralow thresholds," Nature 520:69-76 (2015).
Ye et al., "Monolayer excitonic laser," Nature Photonics 9:733-737, Supplementary Information, pp. 1-12 (2015).

\* cited by examiner

HYBRID SILICON LASERS AND AMPLIFIERS WITH 2D PHOSPHORENE FILM

STATEMENT OF GOVERNMENT INTEREST

The U.S. Government claims certain rights in this invention pursuant to Contract No. DE-ACO2-06CH11357 between the U.S. Department of Energy and UChicago Argonne, LLC, representing Argonne National Laboratory. This invention was made with government support under DMR-1505849 awarded by the National Science Foundation. The government has certain rights in the invention.

FIELD OF THE DISCLOSURE

The present disclosure relates generally to techniques for fabricating lasers and amplifiers and, more particularly, to techniques for hybrid lasers and amplifiers having phosphorene gain regions.

BACKGROUND

Silicon photonics has reached a level of maturity where foundries are able to produce complex circuits involving both optical and electronic components on a single chip. However, silicon lasers remain a key missing component to the complementary metal-oxide-semiconductor (CMOS) foundry device suite. To date, the main approach to integrated lasers are heterogeneous structures in which a direct-gap III-V wafer is bonded, then processed, on top of a passive silicon circuit. Variations of this method include depositing pre-processed III-V chiplets, although clever techniques to grow InP directly on Si are making rapid progress. There remains, however, a need for a gain material that can be deposited or grown directly on silicon. Moreover, ideally it would be beneficial to have a gain material that utilizes silicon not only as a substrate material, but also for mode confinement.

SUMMARY OF THE INVENTION

The present techniques provide for the formation of hybrid silicon lasers and amplifiers.

The present techniques utilize two-dimensional (2D) materials that are able to take established material platforms, such as silicon substrates, beyond their intrinsic limitations. By utilizing thin Van der Waals 2D materials, the present techniques take advantage of quantum confinement effects that give rise to exceptional luminescence, absorption, carrier mobility, large exciton binding energies, and mechanical strength. Various 2D materials may be used. In some examples, and in particular in the optical domain, the 2D materials are 2D phosphorene layers, which are of interest for infrared opto-electronic devices such as photodetectors and saturable absorbers in mode-locked lasers.

In some examples, the present techniques are able to achieve lasing in silicon by the use of 2D materials, such as thin films of phosphorene grown or deposited on a silicon substrate. The direct-gap emission of atomically-thin phosphorene has been used to functionalize a silicon (Si) nanoscale optical resonator, thereby overcoming the indirect band gap limitation of silicon. Moreover, the phosphorene optical emission energy (frequency or wavelength) is controllable by changing the number of atomic layers, resulting in a great deal of versatility for a broad range of applications. The result, as we show, is the establishment of mode confinement contained within a Si material, but with a 2D emitter layer on its surface, thereby providing a hybrid photonic device. That is, a device that is not merely formed on top of a Si substrate, but that provides photon propagation and trapping, at least partially, through that Si substrate.

In accordance with an embodiment, a photonic device comprises: a substrate formed of a semiconductor material, the substrate having a resonator cavity formed therein, the substrate having a mounting surface; and a two dimensional material disposed on the mounting surface of the substrate and extending over the resonator cavity, the two dimensional material being formed of one or more atomic layers of phosphorene, wherein the two dimensional material is configured to provide a photonic gain region for photons propagating in the resonator cavity of the substrate, such that upon external pumping the two dimensional material produces a photon emission, and interacts with the resonator cavity.

BRIEF DESCRIPTION OF THE DRAWINGS

The figures described below depict various aspects of the system and methods disclosed herein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIG. 1G illustrates a side view (y-z plane) of the FDTD simulation. Notice that the evanescent optical field reaches outside of the silicon substrate 102, allowing the optical cavity to couple to the phosphorene material 104 on its surface.

FIG. 1H compares a normalized emission spectra from a hybrid silicon enhanced configuration of FIG. 1A to a native photoluminescence signal from a phosphorene material alone.

DETAILED DESCRIPTION

Provided are techniques for forming hybrid silicon lasers and amplifiers. In various examples, a thin 2D material film may be grown or deposited on a substrate to form a hybrid nanostructure, such as a hybrid laser and/or hybrid amplifier. In some examples, the techniques include depositing or growing, as the 2D material film, a thin film of phosphorene on a silicon (Si) substrate or a substrate formed of other materials. The direct-gap emission of the phosphorene 2D material film a provides a gain region that may be coupled with a resonator cavity formed in the Si substrate, thereby forming a nanoscale optical resonator extending, at least partially, into the Si substrate. In this way, a hybrid nanostructure device is formed, where the device relies upon the both the 2D material and the underlying substrate to form a resonating gain region, for lasing or amplification.

By adjusting the properties of the 2D material film, various hybrid devices may be formed. Furthermore, these hybrid devices may be pumped by external sources, such as via optical pumping or via electrical pumping. With phosphorene, for example, because phosphorene is ambipolar, meaning that it can be doped both p-type and n-type, electrical pumping of a hybrid silicon laser is possible and desirable.

In some examples, the emission wavelengths and gain regions of the hybrid devices may be tuned, i.e., scaled, in a similar manner to that of III-V group on Si integrated lasers. For example, by adjusting the properties of the 2D material film and/or of the underlying substrate characteristics, such as the emission wavelength and/or gain linewidth, can be tuned.

There are numerous ways to adjust such properties. For example, the molecular composition of the 2D material film may be changed. In some examples, the pattern of the 2D material film may be adjusted.

In some examples, the 2D material film is formed of one or more atomic layers of a material, e.g., phosphorene (BP). The number of atomically-thin layers forming the 2D material film may be adjusted to adjust the properties of the hybrid devices herein. In some examples, the 2D material film can have varying thicknesses across the entire film, and thereby providing tuning of characteristics of the formed hybrid device. Power scaling may be adjusted likewise, or by adding more gain material, as well. The results demonstrate that hybrid devices combining the light emitting properties of 2D material films, such as phosphorene, overcome the indirect bandgap limitations of silicon and thereby open up new routes for CMOS-compatible light sources in integrated photonic chips.

Figure 1A:
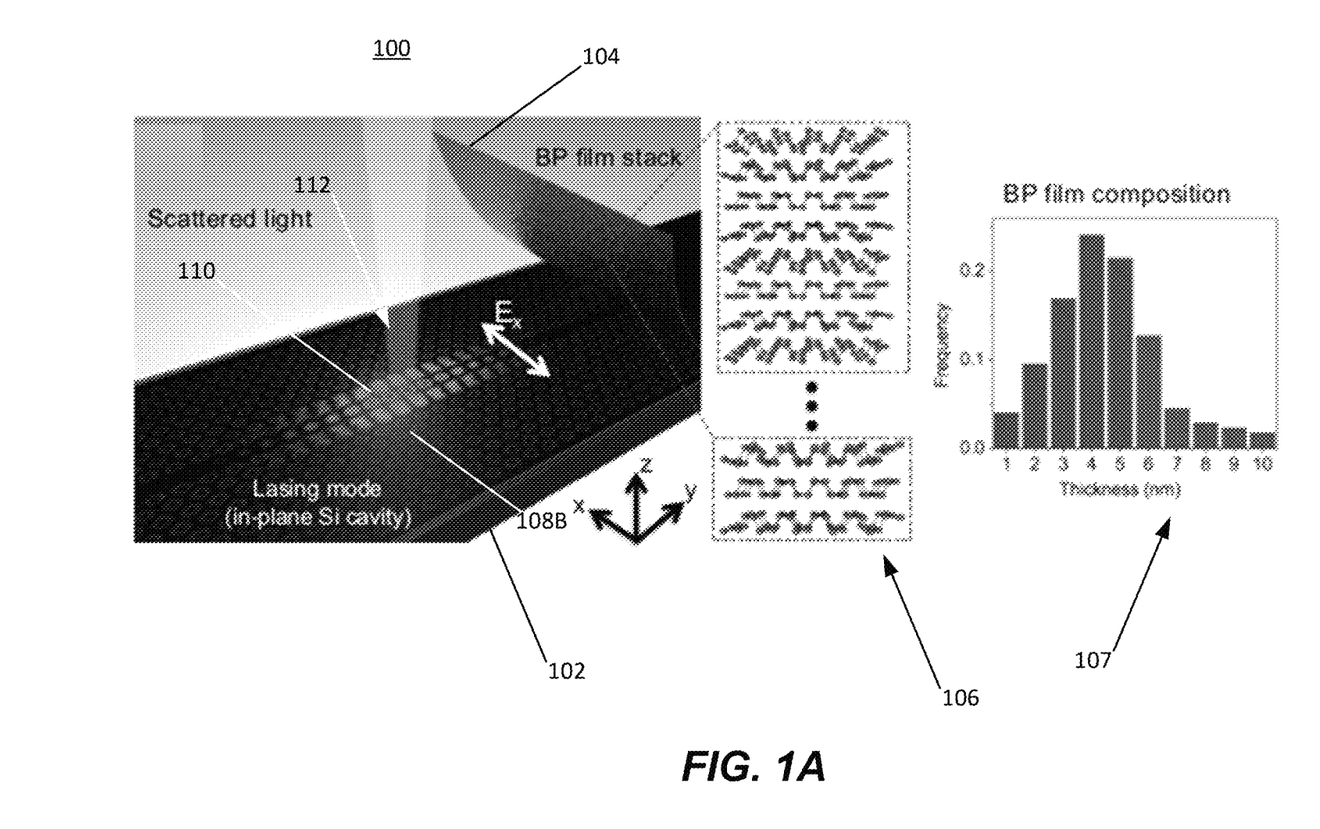
FIGS. 1A-1C are schematic illustrations of a hybrid device, in particular a hybrid laser formed of a photonic crystal silicon substrate providing a resonator cavity and a 2D phosphorene material providing a gain region, in accordance with an example.
Figure 1B:
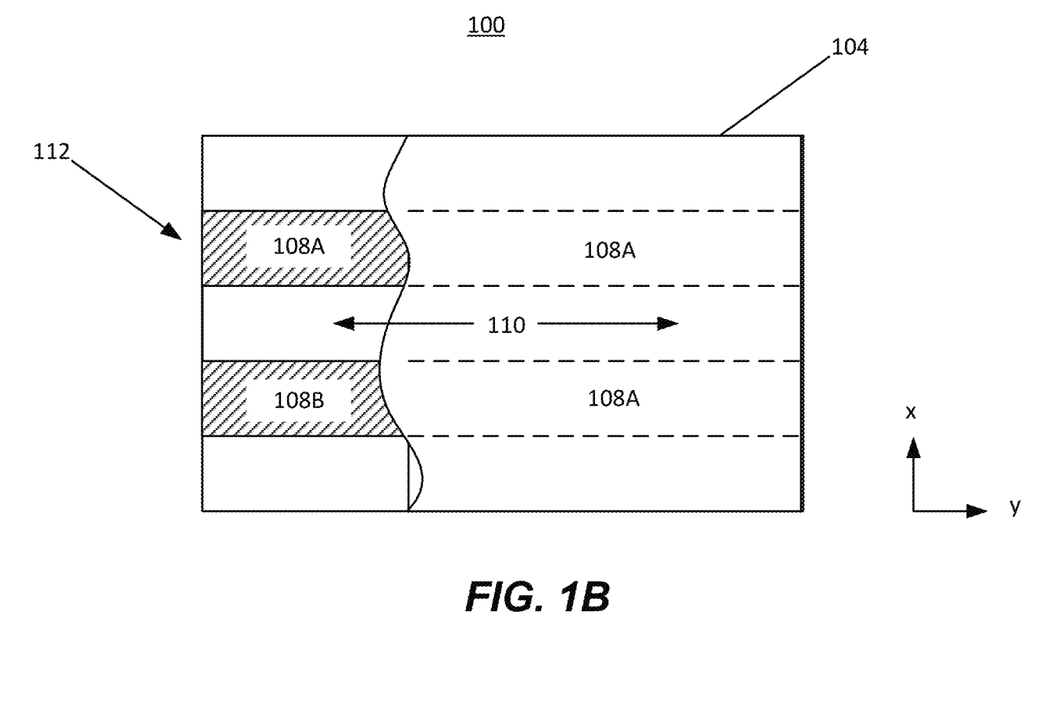
Figure 1C:
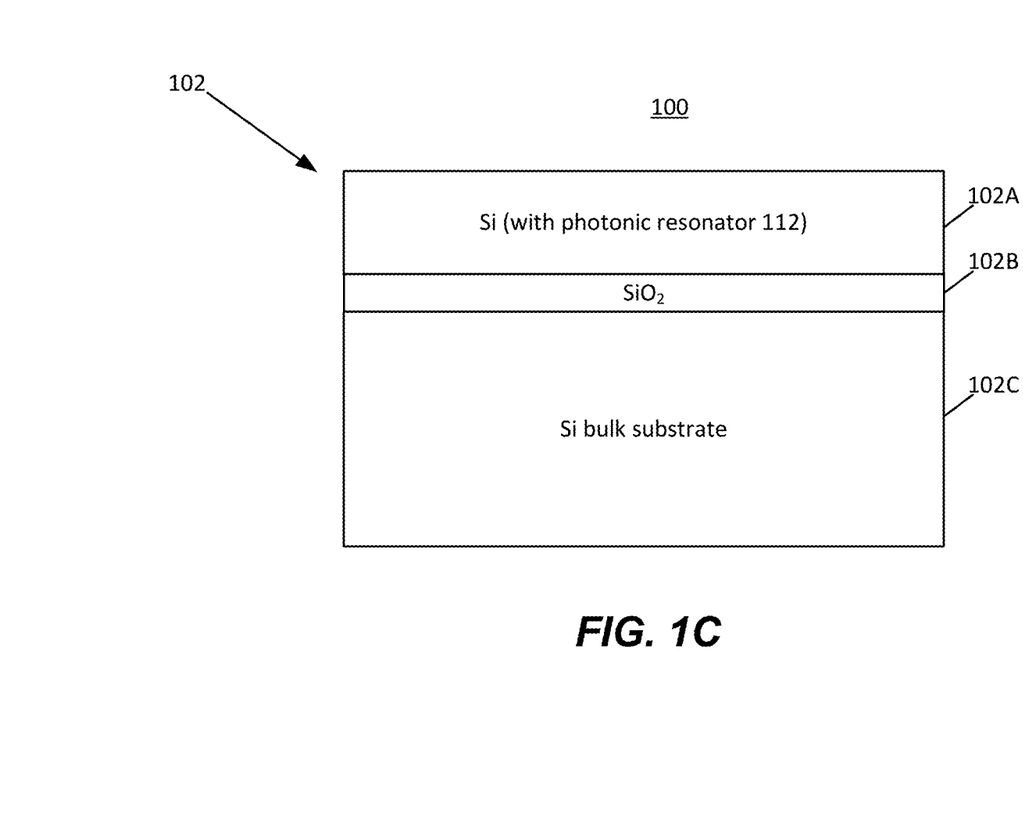

FIGS. 1A-1C illustrate a schematic overview of a hybrid device 100 in the form of a hybrid silicon laser. The hybrid silicon laser 100 is formed of a Si substrate 102 onto which is grown or deposited a 2D material film 104 of phosphorene (see, insert 106), phosphorene being a two-dimensional monolayer of black phosphorus (BP) (see, insert 107). More broadly speaking, we use the term 'few-layer 'phosphorene' for several atomic layers, which is still of a 2D nature. For illustration purposes, in FIG. 1A, the 2D material film 104 is shown partially removed to illustrate nanostructure features within the Si substrate 102. In the schematic illustration of FIG. 1B, the hybrid device 100 is shown with the 2D material film 104 only partially shown.

The Si substrate 102 may have at least a portion that defines a silicon optical resonator, e.g., a photonic crystal (i.e., having a periodic optical nanostructure that affects the motion of photons in the substrate 102). In the illustrated example, the Si substrate 102 is formed of first and second cladding regions 108A and 108B, each having nanostructured holes in a lattice pattern.

The two cladding regions surround a propagation region 110 that is free from nanostructures. In this way, formed within the Si substrate 102 is a photonic resonator (cavity) 112, which is also termed herein a silicon photonic crystal resonator.

In some examples, the photonic resonator 112 may be a mode-gap cavity optimized specifically for a $SiO_2$ silicon on insulator (SOI) configuration. For example, in the illustrated example of FIG. 1C, the photonic resonator 112 is positioned within a first silicon layer region 102A, which is positioned on a thinner $SiO_2$ layer region 102B, which is positioned on a thick silicon substrate 102C. In an example implementation, the region 102A was 220 nm thick, the region 102B was a few microns thick, and the region 102C was a bulk silicon substrate. The use of the $SiO_2$ layer 102B may allow for better thermal conductivity compared a purely air-clad Si cavity.

In the illustrated example, the fundamental (single) mode of the resonator 112 is in the x-y plane. During operation, photons from the phosphorene material 104 are captured and stored in the silicon photonic crystal resonator 112, which in turn provides feedback to the phosphorene material 104, thereby achieving lasing. In the illustrated example, we collected light scattered from the cavity in the z-direction. As a result, the hybrid device 100 has a photonic resonator in the x-y plane and, therefore, there is gain in the x-y layer, which means that the example of FIG. 1A may be configured as an edge emitting hybrid laser. This configuration is provided by way of example. Vertical emission is also possible through geometrical control of the resonator parameters.

The phosphorene 2D material film 104 may be fabricated by a solution-processed method and then dry transferred onto the Si substrate 102, i.e., over the photonic crystal resonator 112 using a polydimethylsiloxane (PDMS) stamp. With the present techniques, the ability to deposit a large-area phosphorene 2D material enables a large number of hybrid devices to be fabricated at once, in contrast to mechanical exfoliation of single flakes or other conventional techniques.

Furthermore, numerous different silicon photonic crystal resonators may be fabricated into a single Si substrate, each having different resonator frequency (wavelength). A 2D material film deposited or grown over the substrate is then used to form different hybrid devices at each of the different silicon photonic resonators. In another example, the broad gain bandwidth of the 2D material film may be combined with different cavity sizes (allowing for multiple optical modes), leading to pulsed lasing via mode-locking or Q-switching.

FIG. 1A illustrates that, as further described below, the 2D material film 104 may be formed of a plurality of different phosphorene layers (e.g., 1, 2, 3, 4, 5, . . . , n BP layers). As explained further, the number of phosphorene layers can determine the emission wavelength of the formed hybrid laser or hybrid amplifier.

The 2D material film 104 may be uniform in thickness across the entire surface. However, in other examples, the thickness can vary, e.g., based on the phosphorene layer composition. By way of example, thickness values may range from 1 nm to 10 nm at different locations across the same 2D material 104 and still maintain desired performance levels, as shown in the plot.

Figure 1D:
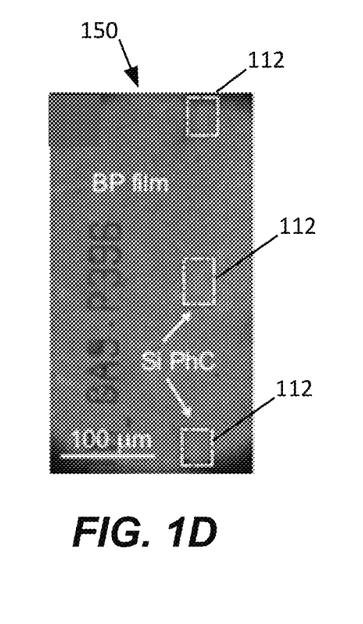
FIG. 1D is an optical microscope image of a hybrid device, showing multiple photonic crystal silicon resonators in a single silicon chip, in accordance with an example.
Figure 1E:
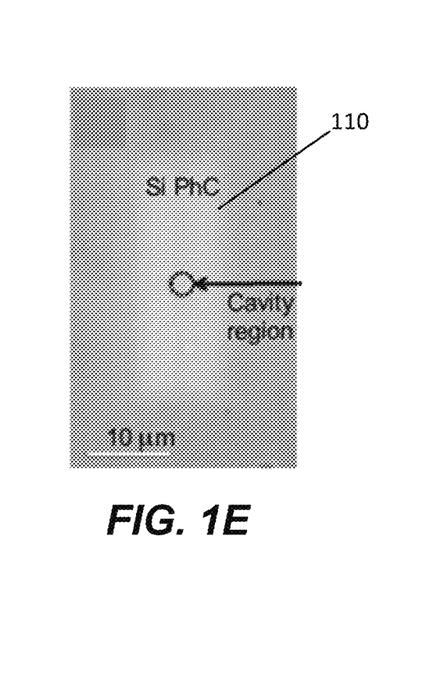
FIG. 1E illustrates a zoomed image of one of the photonic crystal resonators of FIG. 1B, in accordance with an example.

FIG. 1D provides an optical microscope image of an example fabricated device, shown at 20× magnification. In the illustrated example, the phosphorene 2D material film 104 covers multiple photonic crystal resonators 112, to form a single integrated photonic silicon chip 150. FIG. 1E illustrates a zoomed image of one of the photonic crystal resonators 112, showing the propagation region 110 as a cavity imaged on an InGaAs camera (100× magnification).

Photonic crystals are useful media for realizing nanoscale lasers due to their large quality factors (Q) and diffraction-limited mode volumes (V) which enhance the spontaneous emission rate through the Purcell effect (~Q/V). In an example implementation, the photonic crystal resonators 112 were formed with electron-beam lithography and standard nanofabrication techniques. In an example, the slab thickness layer 102A (220 nm) with air holes of nominal radius 100 nm at a 404 nm pitch was formed. Note the propagation region 110 was formed, as a result, in the center region and, in this example, covered approximately 1 µm² of the 26 µm×9 µm² device, whereas the phosphorene material 104 spanned the surface shown.

Figure 1F:
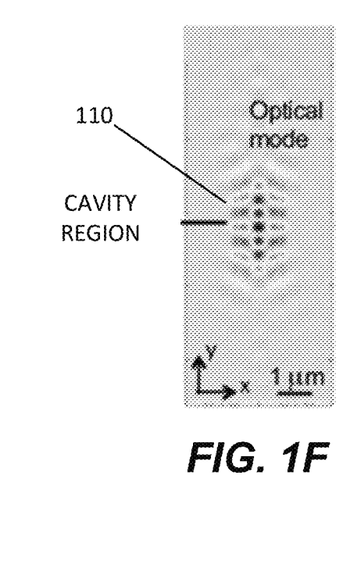
FIG. 1F illustrates a finite-difference time-domain (FDTD) simulation of the photonic crystal resonator of FIG. 10, in accordance with an example.
Figures 1G, 1H:
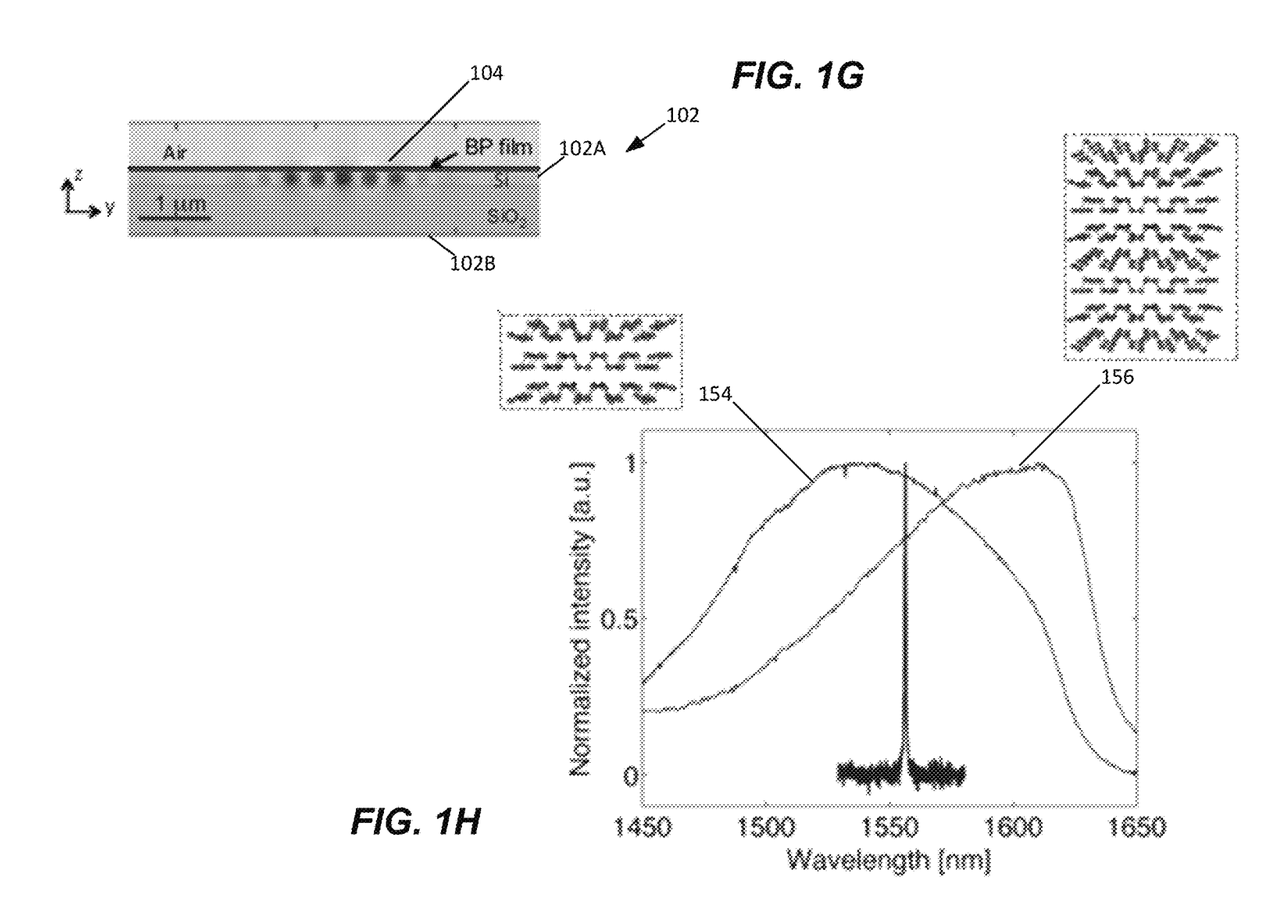

FIG. 1F illustrates a finite-difference time-domain (FDTD) simulation of the optical cavity, i.e., the propagation region 110, showing the fundamental resonator mode oscillating in-plane (x-y) with a mode volume V≈1.8(lambda/n0)³~0.15 um³. Likewise, FIG. 1G is a side view (y-z plane) of the FDTD simulation. Notice that the evanescent optical field reaches outside of the silicon substrate 102, allowing the optical cavity to couple to the phosphorene material 104 on its surface.

FIG. 1H illustrates plot comparisons of gain spectra for different thicknesses for the 2D material film 104. Plot 154 shows the emission spectra for a 2D material film formed of a thin phosphorene layer (or a smaller number of BP layers). The plot 156 shows the emission spectra for a thicker 2D material film formed of a larger number of phosphorene layers. The plots 154 and 156 are shown with representative indications (not to scale or number) of differences in numbers of BP layers. As shown, there is great variability in emission profiles for different thicknesses of a 2D material films. In this way, it is possible to tune the emission bandwidths by using different thicknesses for the 2D material.

An advantage of the hybrid laser 100 is that it is operational at room temperatures. For example, we have been able to achieve lasing by optically pumping (i.e., exciting) the hybrid device at room temperature (292 K) with a continuous-wave 1310 nm laser as the external pumping source. At 1310 nm silicon is transparent, which means we avoid losses due to carrier absorption and heating. The samples may be operated under vacuum in order to prevent degradation of the phosphorene material, while in other examples, a passivation coating or chemical treatment may be applied over the phosphorene material to achieve the same result.

Figure 2A:
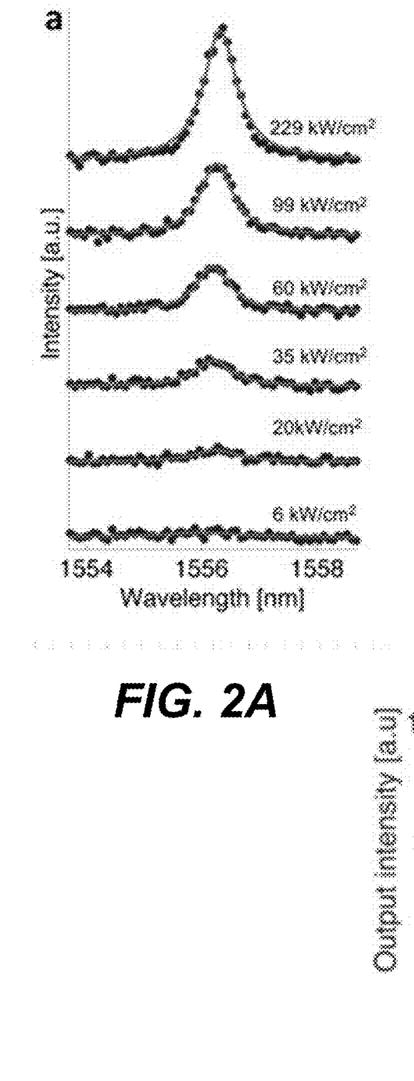
FIG. 2A illustrates a spectral evolution of the hybrid laser as a function of optical pump intensity, in accordance with an example.

FIG. 2A illustrates the spectral evolution of the hybrid laser as a function of optical pump intensity, in an example. The plotted dots represent the cavity emission of the hybrid laser 100, after a background emission has been subtracted from the cavity emission. A peak emission from the cavity is apparent at 28 kW/cm², and grows with increasing pump power, demonstrating optical feedback and amplification in the resonator 112. We estimate the cold cavity Q with the phosphorene material 104 on the surface of the substrate 102 to be on the order of 1,000. Note that values here are different from the energy absorbed by the phosphorene material itself, which we have not measured but which may be in the order of 3-5% for a few layer phosphorene, according to the scientific literature.

Figure 2B:
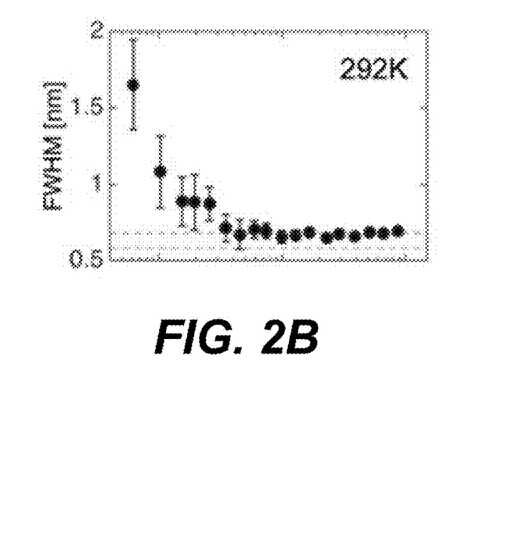
FIG. 2B is a plot of measured emission line width (FWHM, full-width at half-maximum) as a function of input pump intensity, in accordance with an example.

As demonstration of the stimulated emission behavior of the hybrid laser 100, we measured the emission line width (FWHM, full-width at half-maximum) as a function of input pump intensity, in FIG. 2B. We fit the resulting spectra with Lorentzians, with typical results shown as the solid lines in FIG. 2A. Error bars in FIG. 2B are the root mean square error of the fit. FIG. 2B shows the characteristic spectral narrowing of stimulated emission going from low to high pump power.

Figure 2C:
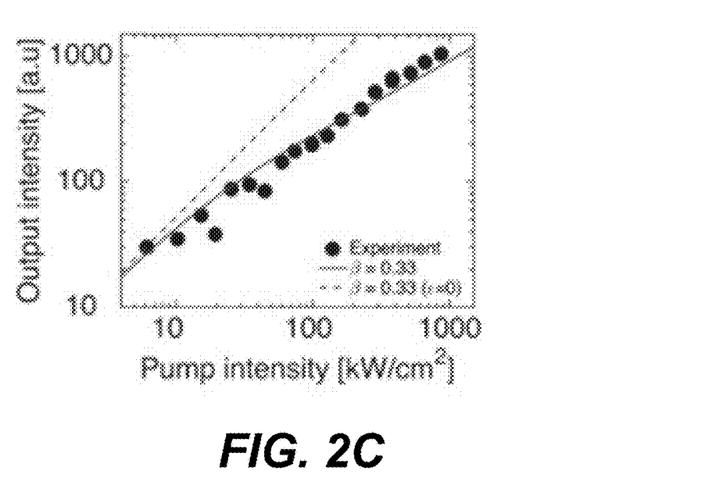
FIG. 2C is a plot of output intensity from a hybrid laser versus pump intensity, measured as kW/cm$^2$, in accordance with an example.

FIG. 2C is a plot of output intensity from the hybrid laser 100 versus pump intensity, measured as kW/cm², i.e., $Light_{IN}$-$Light_{OUT}$(L-L) curve. The nearly linear L-L curve is typical of lasers with large spontaneous emission factor β. in this illustrated example. We used a rate equation model to confirm the stimulated emission response (dashed line). The emitted signal (blue dots) is defined as the background-subtracted spectra integrated under the peak. The nearly linear L-L curve is typical of lasers with high β. For this example, we used a rate equation model to confirm the stimulated emission response (solid red line). In this example, the laser experienced gain compression, and accompanying roll-off of the emission, due to the small active volume. In this demonstration, we estimate between 4-10 pieces of solution-processed BP of approximately 500×100 nm² are on the cavity region. The dashed red line shows the case without gain compression and near-linear, 'thresholdless' performance.

There are a number of features to note from the data in FIGS. 2A-2C. First, nanolasers with high β factors such as the hybrid laser 100, line widths are narrow even below threshold pump levels. Second, the lower bound of the line width measurements is limited by the spectrometer resolution.

Figure 3A:
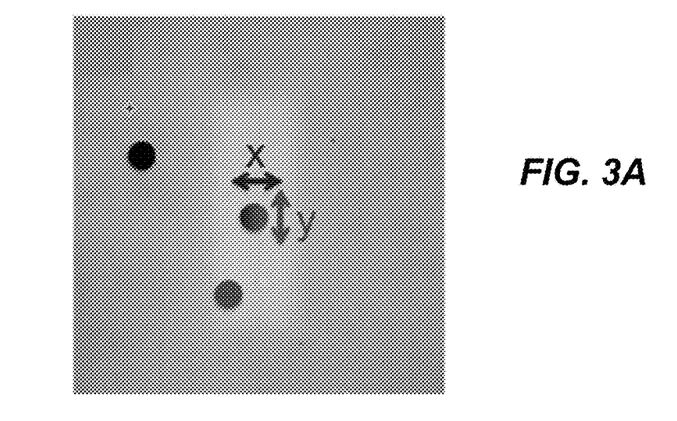
FIG. 3A illustrates a map of spatial locations of optical pumping into a hybrid silicon-2D phosphorene laser, in accordance with an example.

Further we examined the localization of the lasing mode by comparing the emission at various spatial points along the hybrid laser. FIG. 3A illustrates a map of the locations where we optically pumped (i.e., excited) a phosphorene 2D material film, such as film 104. While the underlying silicon substrate has different structures at different locations (plain silicon in outer regions not shown, photonic crystals in cladding regions such as regions 108A and 108B, and a cavity region such as region 110), the phosphorene 2D material film covers the entire image in FIG. 3A. Thus at each point, we probed the effect of the local photonic density of states on the phosphorene emission.

Figure 3B:
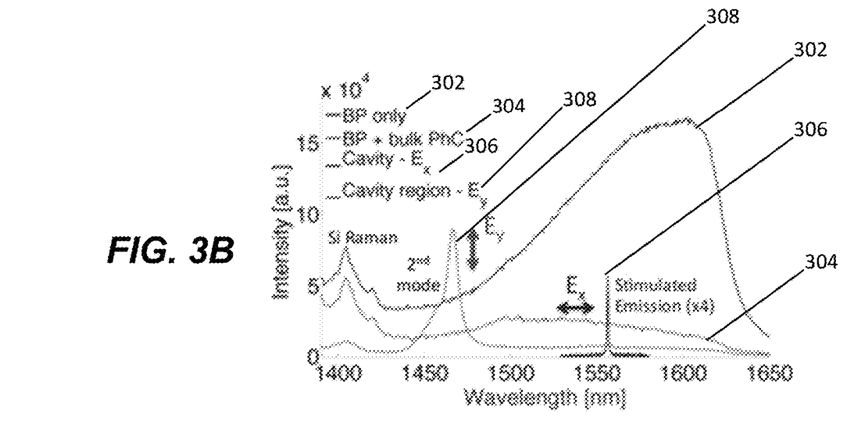
FIG. 3B is a plot a resulting emission spectra for the various optical pumping locations of FIG. 3A, in accordance with an example.
Figure 3C:
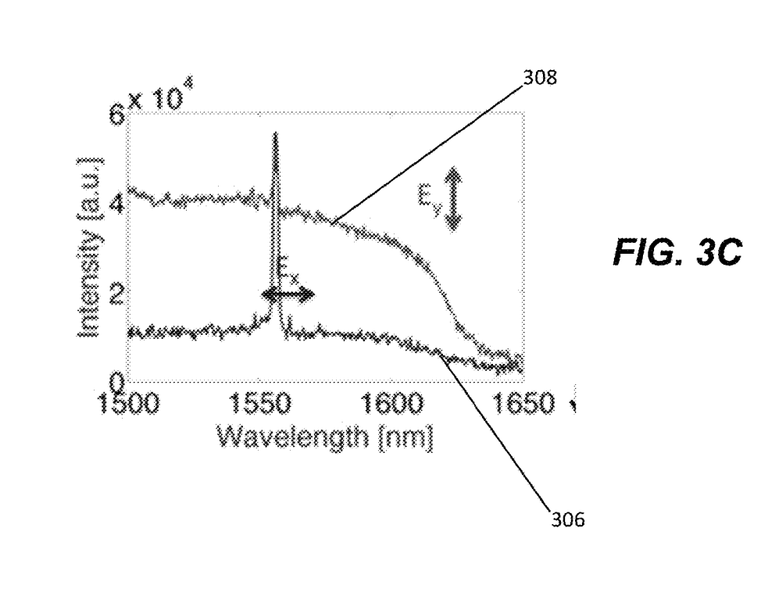
FIG. 3C is an expanded portion of the plot in FIG. 3B.
Figure 3D:
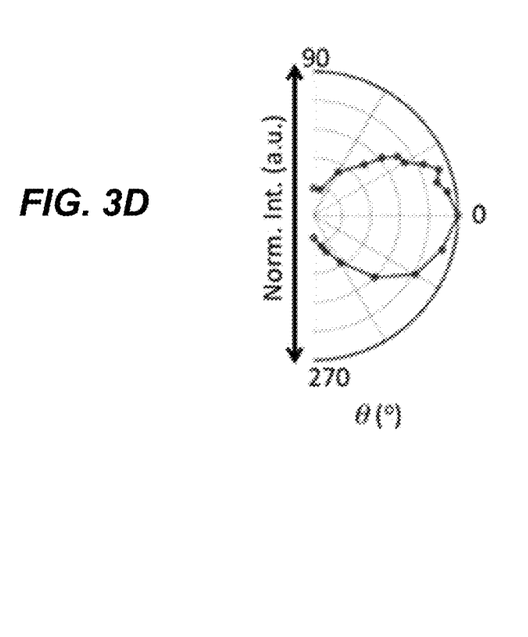
FIG. 3D illustrates full 180° polarization measurements of an emission, in accordance with an example.

FIG. 3B illustrates the spectra captured at the various locations at a pump intensity of a few hundred kW/cm². The phosphorene emission from a region corresponding to the unstructured silicon is shown at plot 302; and the phosphorene corresponding to the photonic crystal bulk cladding regions is shown at plot 304. When we pumped phosphorene above the cavity region (306 using a polarizer 0°-$E_g$), we observe that the emission spectrum is much narrower than the phosphorene for plots 302 or 304. The peak is polarized in the x-direction, consistent with the fundamental mode of the cavity. We observe that the cavity peak is greatly reduced when collecting emissions along the orthogonal polarization (308, polarizer 90°-$E_{xy}$), as confirmed by the zoom view of the cavity response in FIG. 3C. FIG. 3D shows full 180° polarization measurements of the emission from the resonator 112 at 1556 nm. We further examined, the power-dependence of the different emission regions.

To examine an example hybrid laser formed in accordance with the example of FIG. 1, we employed the following protocols. For the experiments, we used a microscope photoluminescence (μPL) setup (Olympus 100×, N.A. 0.8) with a 30 cm Princeton spectrometer and a TEC-cooled InGaAs detection array. Samples were kept at room temperature (292 K) under vacuum (2×10 −4 mTorr) to prevent oxidation of the sample. To excite the hybrid laser, we optically pumped the device with a 1310 nm (0.95 eV) continuous-wave diode laser so as to avoid absorption and heating in the silicon nanocavity ($E_y$=1.1 eV). The pump and collection paths (z-direction) were perpendicular to the resonator (x-y plane). For the stimulated emission experiments, we included a polarizer in the collection path set to maximize the cavity peak and reduce residual background. In a separate examination, we measured an average radiative lifetime of 500 ps for the phosphorene film on a plain silicon substrate.

In an example implementation, for phosphorene film preparation, we employed the following. Black phosphorus (BP) crystals (5N, Smart-Elements) were stored in an Ar glovebox with less than 1 ppm O2. The 45 mg of BP crystal was placed in a sealed tip sonicator setup with 45 mL of deoxygenated water and 2% w v-1 sodium dodecyl sulfate (SDS) under an Ar atmosphere (less than 10% relative humidity). The deoxygenated water with 2% w/v SDS was prepared by purging with ultrahigh purity grade Ar for at least 1 h to remove dissolved oxygen. The sealed setup was connected to the sonicator (Fisher Scientific model 500 sonic dismembrator) in ambient conditions, and phosphorene crystals were exfoliated by ultrasonication at 70 W for 1 h in an ice bath. Subsequently, the solution was centrifuged at 7,500 r.p.m for 2 h at 15° C. (Avanti J-26 XP, Beckman Coulter) to enrich few-layer phosphorene nanosheets, and then 35 mL of supernatants were subjected to ultracentrifuge at 15,000 r.p.m. for 2 h at 22° C. (SW32Ti rotor, Optima L-80 XP, Beckman Coulter). The supernatants were disposed, and the precipitation with 10 mL of deoxygenated water was sonicated at 8 W for 1 min to minimize the SDS concentration.

For the phosphorene film (i.e., nanosheets) transfer, as-prepared 10 mL of phosphorene dispersion was vacuum-filtered on 47 mm diameter anodic aluminum oxide (AAO) membranes with 20 nm pore size (What-man™) in ambient conditions. Subsequently, the BP nanosheets on the membrane were rinsed with deoxygenated water to remove the SDS. Before the BP nanosheets on the membrane were fully dried, the nanosheets were transferred to the Si cavity-formed substrates by poly-methylsiloxane (PDMS) stamping. To promote a surface coverage of the phosphorene nanosheets, deoxygenated water was sprayed on the substrates prior to the stamping.

Figure 4:
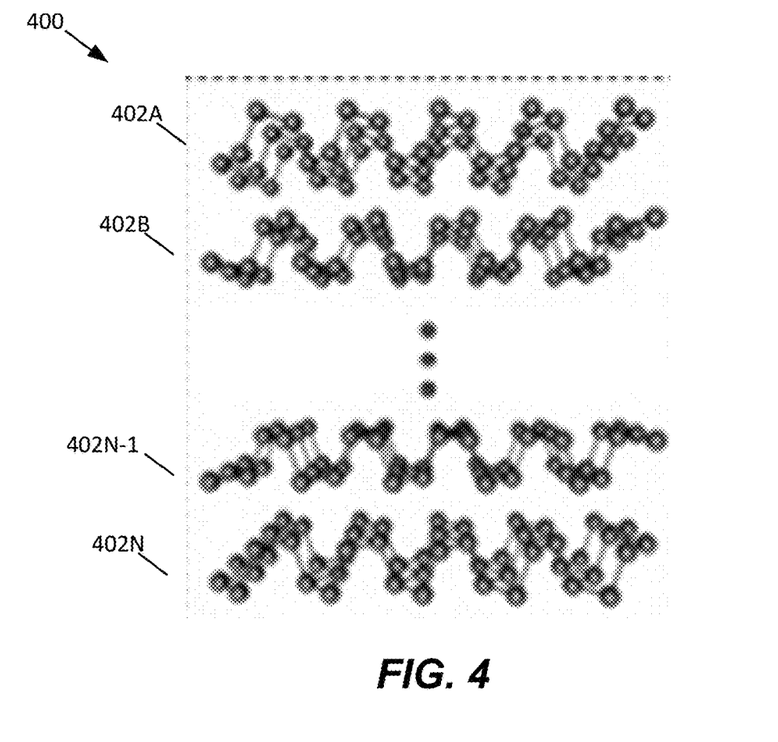
FIG. 4 illustrates an example 2D material film composed of several individual atomic layers, e.g., a plurality of phosphorene atomic layers, in accordance with an example.

The 2D material films described herein are formed of one or more thin atomic layers, wherein each thin film layer may be an atomic layer thin film. FIG. 4 illustrates an example. A 2D material film 400 is formed of black phosphorous (BP) and, in particular, a plurality of individual BP thin atomic layers 402A-402N, where each layer is one BP atomic layer thick, e.g., approximately 0.53 nm in thickness. One of the advantages of using BP layer 402 formed of phosphorene is that phosphorene atomic layers are very thin and can be applied like a coating if required. In fact, in some examples, a range of phosphorene thicknesses are used. We estimate between 5-9 layers in our wavelengths of interest.

Another advantage of using the 2D materials such phosphorene is that we can tune operation of the hybrid devices formed herein. We have found that the bandgap emissions wavelength of a hybrid laser or amplifier may be tuned by adjusting the thickness of the 2D material thereby adjusting the gain bandwidth, e.g., by selecting the number of atomic thin layers that form the 2D material film. The layer-tunable emission is particularly advantageous for use with Si substrates and other substrates common in CMOS circuit design. The layer-tunable emission allows us to produce hybrid devices that operate in the desired wavelength region for several major established communications band (C,L,S, O), as well as proposed ones in the mid-infrared.

The 2D material film 400 may be formed of any number of phosphorene layers 402, from 1, 2, 3, 4, 5, 6, 7, 8, 9, or 10, or higher numbers of layers, where the number of layers determines the emission bandgap. The table below illustrates example numbers of BP layers (when depositing the BP on $SiO_2$, or similar dielectric) that may be used to form the 2D material films herein, with the expected maximum gain wavelength of the resulting gain spectra, lambda (nm), and the optical emission energy, Eopt (ev). Small shifts in emission energy occur on different substrates due to different dielectric environments.

| BP on SiO2 layer # | Eopt [eV] | Lambda [nm] |
|---|---|---|
| 1 | 1.78 | 696 |
| 2 | 1.22 | 1018 |
| 3 | 0.99 | 1247 |
| 4 | 0.87 | 1427 |
| 5 | 0.79 | 1574 |
| 6 | 0.73 | 1699 |
| 7 | 0.69 | 1807 |
| 8 | 0.65 | 1902 |
| 9 | 0.62 | 1987 |
| 10 | 0.60 | 2063 |
| 15 | 0.53 | 2354 |
| 20 | 0.49 | 2555 |
| 30 | 0.44 | 2824 |
| 50 | 0.40 | 3127 |
| 100 | 0.36 | 3463 |
| 150 | 0.34 | 3618 |
| 200 | 0.33 | 3710 |
| 300 | 0.32 | 3819 |
| 400 | 0.32 | 3883 |
| 500 | 0.32 | 3925 |

Figure 5A:
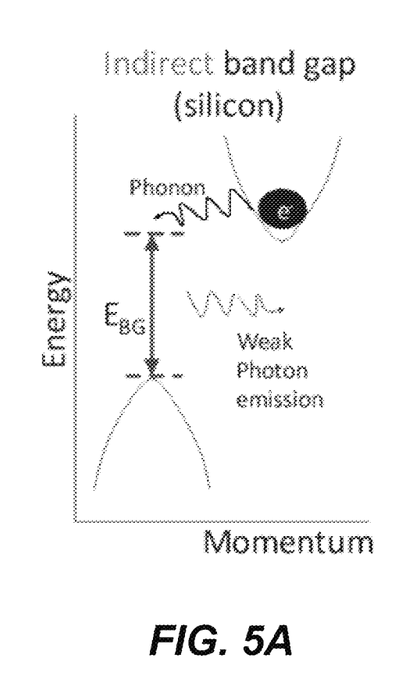
FIGS. 5A and 5B illustrate an indirect bandgap transition in Silicon, without a 2D material, and the resulting direct bandgap transition in of the hybrid structure, resulting from the use of a 2D material, in accordance with an example.
Figure 5B:
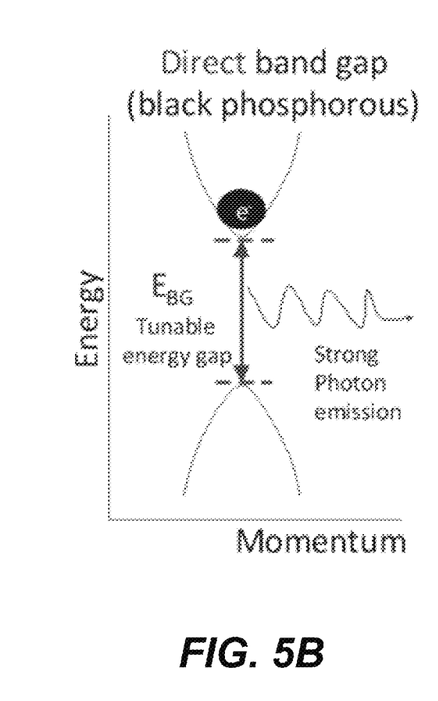

The hybrid device is able to emit at and around these different wavelengths due to the tunable direct bandgap of the BP thin film layer (see, e.g., FIG. 5B). This is in contrast to silicon by itself (see, e.g., FIG. 5A) which has a fixed, indirect, bandgap that is not useful for optical emission.

With this laser tunability, hybrid devices (lasers, amplifiers and photodetectors) can be formed emitting at any number of desirable wavelength ranges, including, at 1550 nm, at 1580 nm, over a 30 nm wide C band from 1535-1565 nm wide, over a 40 nm wide L band from 1565-1605 nm. More broadly, devices herein can be formed to emit at any wavelength from at or about 600 nm to at or about 4000 nm, limited only by the BP emission, by way of example.

Further still, additional tuning can be achieved by selectively patterning the silicon substrate, i.e., selectively sizing the photonic resonator. The cavity linewidth of the photonic resonator determines the quality factor of the resulting laser and is much narrower than the gain bandwidth of the BP film. As shown with the gain bandwidth plots 154 and 156, any frequency within these spectra may be tuned as the output emission frequency (and thus wavelength) by appropriately setting the silicon cavity resonator (e.g., photonic resonator) properties. For example, in some implementations, any laser emission wavelength over a large 70 nm gain bandwidth may be selected, and using the same 2D material film. The ability to tune both the emission frequency and the emission bandwidth provides further advantages for certain applications. Tuning of the emission bandwidth is particular useful when forming hybrid amplifiers using the present techniques. Other tuning options are available. Tuning may be achieved via strain tuning. In optical pumping examples, tuning may be achieved by pumping at different energy levels. While examples are described for tuning lasers, hybrid amplifiers formed with the present techniques may be similarly tuned, where these amplifiers are used to amplify a first photonic emission, at a first wavelength, from an optical pumping photon source, at a second pumping wavelength.

While examples are described here for a Si substrate, any number of different materials may be used for the substrate, including other semiconductors such as Gallium Arsenide (GaAs), Indium Phosphide (InP), and their ternary or quaternaries, or insulators such as Silicon dioxide ($SiO_2$), Silicon Nitride (SiN), Aluminum Oxide ($Al_2O_3$,), etc. The insulators are attractive for applications in the visible since they are transparent in this spectral region. Any of these substrates may be formed to include photonic resonator structures, for example. More generally, the present techniques can be used with other optical confinement mechanisms, embedded within a substrate. Examples include phosphorene sitting on a surface above a silicon distributed Bragg reflector (DBR) or distributed feedback laser (DFB) structure such as in current III-V on silicon lasers, slot-waveguides (where the air gap between two high-dielectric regions is filled with phosphorene), or plasmonic waveguides (metal-insulator-metal or insulator-metal-insulator). In these examples, the waveguides are formed as resonator cavities within the substrate, e.g., a distributed Bragg reflector resonator cavity, distributed feedback laser resonator cavity, etc. For example, in some examples, a Bragg grating may be distributed along a waveguide propagation region in a Si substrate and a underneath the BP 2D material film gain region, forming a distributed feedback laser resonator cavity. In other examples, a Bragg grating may be formed at one end of the waveguide propagation region in the Si substrate opposite an exit facet to form a resonator cavity under the BP 2D material film, such as in a distributed Bragg reflector resonator cavity. In any of these example resonator cavities, as well as with the others herein, it will be appreciated that further tuning of hybrid laser/hybrid amplifier characteristics maybe be achieved by temperature tuning the resonator cavity, e.g., tuning of the optical path length of the cavity.

With the techniques herein, any number of hybrid devices may be formed, i.e., devices that rely upon both the underlying substrate and a 2D material thereon to establish photonic propagation, through evanescent coupling. These devices can then be formed into photonic integrated circuits. For example, a pump laser device may be placed on a Si substrate that has been formed into one or more hybrid lasers, through photonic crystal patterns in the Si substrate and capped with a phosphorene 2D material. The pump laser optically pumps the one or more hybrid lasers. In the case of multiple hybrid lasers, each may be tuned to a different emission wavelength, for example, by capping each laser with a different number of phosphorene layered 2D materials and tuning the silicon cavity. Optical modulators may be positioned over each of the resonators of the hybrid lasers where the output of each modulator may be coupled to an optical multiplexer feeding a single- or multi-mode optical fiber output. This is an example, any number of silicon photonic chips may be formed from hybrid structures made available from the present techniques.

Figure 6A:
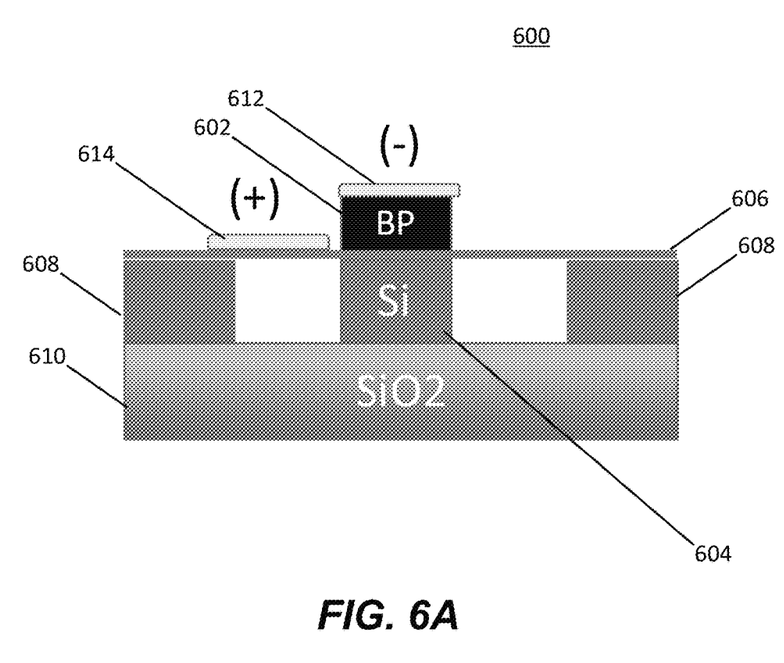
FIG. 6A illustrates another example hybrid device that may be electrically pumped, in accordance with an example.

FIG. 6A illustrates an example electrically pump hybrid amplifier 600, in accordance with an example herein. The amplifier 600 includes 2D material film 602, formed of one or more BP layers. The 2D material film 602 is above a Si resonator 604 and the evanescent optical field extends into, and couples with the BP film, through a thin contact spacer 606. The Si resonator 604, is formed in a Si substrate 608 that extends above an $SiO_2$ substrate 610. To electrically pump the structure, two metal electrodes, one designated for example purposes as a minus, "−" term electrode, 612, the other designated as a plus, "+" electrode 614 are shown. Electrical current provided through these electrodes 612 and 614, from a current source not shown, may be used to electrically pump the hybrid amplifier 600.

Figure 6B:
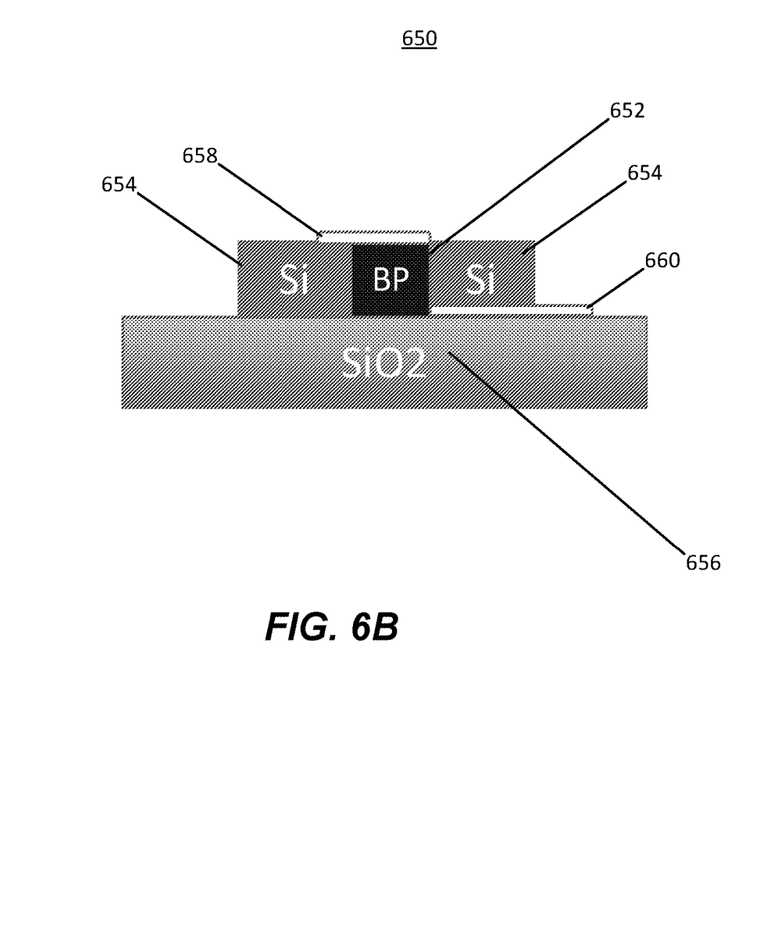
FIG. 6B illustrates another example hybrid device that may be electrically pumped, in accordance with an example.

FIG. 6B illustrates another example electrically pump hybrid amplifier 650, having a BP 2D material film 652 formed sandwiched between two cladding Si layers 654 formed directly top of $SiO_2$ substrate 656, with a first metal electrode 658 and a second metal electrode 660, as shown. Sample electrodes that may be used include any industry-standard electrodes for p-type or n-type contacts.

In some examples, the BP layers in the examples of FIGS. 6A and 6B (as well as in the other examples herein) may be a continuous film of a few layers of BP, using a solution process. In some examples, the BP layers may be selectively grown few-layer BP layers, using a CVD processing, in which there are spacer layers (i.e., insulator layers) between each of the BP atomic layers or between groups of BP atomic layers.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding; and no unnecessary limitations should be understood therefrom, as modifications within the scope of the invention may be apparent to those having ordinary skill in the art.

What is claimed:

1. A photonic device comprising:
   a substrate formed of a semiconductor material, the substrate having a resonator cavity formed therein, the substrate having a mounting surface; and
   a two dimensional material disposed on the mounting surface of the substrate and extending over the resonator cavity, the two dimensional material being formed of one or more atomic layers of phosphorene, wherein the two dimensional material is configured to provide a photonic gain region for photons propagating in the resonator cavity of the substrate, such that upon external pumping the two dimensional material produces a photon emission.

2. The photonic device of claim 1, wherein the substrate is a Silicon substrate.

3. The photonic device of claim 2, wherein the resonator cavity is a photonic crystal resonator formed in the Silicon substrate.

4. The photonic device of claim 2, wherein the resonator cavity is a distributed Bragg reflector resonator formed in the Silicon substrate.

5. The photonic device of claim 2, wherein the resonator cavity is a distributed feedback laser resonator formed in the Silicon substrate.

6. The photonic device of claim 1, wherein the two dimensional material comprises at least 1 atomic layer of phosphorene (BP).

7. The photonic device of claim 6, wherein the two dimensional material comprises 2-10 atomic layers of phosphorene (BP).

8. The photonic device of claim 6, wherein the two dimensional material comprises 10-100 atomic layers of phosphorene (BP).

9. The photonic device of claim 6, wherein the two dimensional material comprises 10-500 atomic layers of phosphorene (BP).

10. The photonic device of claim 1, further comprising an optical pump laser configured to provide photonic pumping of the two dimensional material, the photonic pumping being at a different wavelength than a wavelength of the photon emission.

11. The photonic device of claim 1, further comprising a first electrode and a second electrode both positioned to provide a pump current, from an external current source, to the photonic device.

12. The photonic device of claim 1, wherein the two dimensional material comprises different atomic layers of phosphorene at different locations on the two dimensional material.

13. A hybrid amplifier comprising:
    a semiconductor substrate having a resonator cavity;
    a two dimensional material disposed on a mounting surface of the semiconductor substrate and extending over the resonator cavity, the two dimensional material being formed of one or more atomic layers of phosphorene, wherein the two dimensional material is configured to provide a photonic gain region for photons propagating in the resonator cavity of the substrate; and
    an electrode configuration having at least one electrode disposed at the two dimensional material to pump current into the two dimensional material for conversion into photons for propagation in the resonator cavity, the two dimensional material to produce a photon emission of the hybrid amplifier in response to an external current source supplying the pump current to the electrode configuration.

14. The hybrid amplifier of claim 13, wherein the electrode configuration comprises at least additional electrode for connecting to the external current source.

15. The hybrid amplifier of claim 13, further comprising a contact spacer disposed between the resonator cavity and the two dimensional material.

* * * * *